(12) United States Patent
Onishi et al.

(10) Patent No.: US 7,538,357 B2
(45) Date of Patent: May 26, 2009

(54) SEMICONDUCTOR LIGHT EMITTING DEVICE

(75) Inventors: Toshikazu Onishi, Kyoto (JP); Tatsuya Tanigawa, Osaka (JP); Tetsuzo Ueda, Osaka (JP)

(73) Assignee: Panasonic Corporation, Osaka (JP)

( * ) Notice: Subject to any disclaimer, the term of this patent is extended or adjusted under 35 U.S.C. 154(b) by 490 days.

(21) Appl. No.: 11/195,639

(22) Filed: Aug. 3, 2005

(65) Prior Publication Data
US 2006/0038191 A1    Feb. 23, 2006

(30) Foreign Application Priority Data
Aug. 20, 2004   (JP)   .............. 2004-240484
Oct. 28, 2004   (JP)   .............. 2004-313596

(51) Int. Cl.
  *H01L 29/207* (2006.01)
(52) U.S. Cl. .................. 257/93; 257/E33.069
(58) Field of Classification Search .......... 257/93, 257/E33.069
See application file for complete search history.

(56) References Cited

U.S. PATENT DOCUMENTS

| | | | |
|---|---|---|---|
| 5,104,823 A * | 4/1992 | Mand ................... | 438/23 |
| 5,191,624 A * | 3/1993 | Ito et al. ............... | 385/7 |
| 5,373,174 A * | 12/1994 | Yamamoto ............. | 257/88 |
| 5,543,638 A * | 8/1996 | Nettelbladt et al. ...... | 257/98 |
| 6,236,033 B1 | 5/2001 | Ebbesen et al. | |
| 6,285,020 B1 | 9/2001 | Kim et al. | |
| 6,847,057 B1 * | 1/2005 | Gardner et al. ......... | 257/99 |
| 2001/0021208 A1 | 9/2001 | Ueyanagi | |
| 2002/0018501 A1 | 2/2002 | Hatakoshi et al. | |
| 2002/0060316 A1 * | 5/2002 | Matsuyama .......... | 257/12 |
| 2002/0134987 A1 * | 9/2002 | Takaoka .............. | 257/98 |
| 2003/0064536 A1 | 4/2003 | Yamada | |
| 2005/0156152 A1 * | 7/2005 | Choi et al. .......... | 257/13 |

FOREIGN PATENT DOCUMENTS

| | | |
|---|---|---|
| JP | 2000-171763 | 6/2000 |
| JP | 2001-133618 | 5/2001 |
| JP | 2001-189519 | 7/2001 |
| JP | 2001-244564 | 9/2001 |
| JP | 2003-086896 A | 3/2003 |

(Continued)

OTHER PUBLICATIONS

Japanese Office Action, with English translation, issued in Japanese Patent Application No. JP 2005-219046, mailed Nov. 25, 2008.

(Continued)

*Primary Examiner*—Wai-Sing Louie
*Assistant Examiner*—Bilkis Jahan
(74) *Attorney, Agent, or Firm*—McDermott Will & Emery LLP

(57) ABSTRACT

A semiconductor light emitting device includes: a cavity including a mesa formed over a substrate, the mesa having an active layer and being isolated by a recess formed around the mesa; and a resin layer with which the recess is filled. On the upper surface of the cavity, which is a light output surface through which light emitted from the active layer is output, a metal film having an opening whose diameter is smaller than the emission wavelength of the emitted light is formed.

36 Claims, 8 Drawing Sheets

FOREIGN PATENT DOCUMENTS

| | | |
|---|---|---|
| JP | 2003-142775 | 5/2003 |
| JP | 2003-174234 | 6/2003 |
| JP | 2003-188471 A | 7/2003 |
| JP | 2003-188475 A | 7/2003 |
| JP | 2004-055688 A | 2/2004 |
| JP | 2005-308658 | 11/2005 |

OTHER PUBLICATIONS

Hashizume, J., et al., "Enhanced optical near-field of micro-aperture surface emitting laser using localized Plasmon", Preliminary Material for the 64th Annual Meeting of Japan Society of Applied Physics, 2003, p. 1228, 1p-T-21.

Chen, F., et al., "Fabrication of Very Small Aperture Laser (VSAL) from a Commercial Edge Emitting Laser", Jpn. J. Appl. Phys., Mar. 2001, pp. 1794-1795, vol. 40 Part 1 No. 3B, The Japan Society of Applied Physics.

Shinada, S., et al., "Near-field Analysis of Micro-Aperture Surface Emitting Laser", Institute of Electronics, Information, and Communications Engineers, 1999, pp. 19-24, vol. 98 No. 509.

\* cited by examiner

SEMICONDUCTOR LIGHT EMITTING DEVICE

CROSS-REFERENCES TO RELATED APPLICATIONS

This application claims priority under 35 U.S.C. 119 on Patent Application No. 2004-240484 filed in Japan on Aug. 20, 2004, and Patent Application No. 2004-313596 filed in Japan on Oct. 28, 2004, the entire contents of all of which are incorporated herein by reference. The entire contents of Patent Application No. 2005-219046 filed in Japan on Jul. 28, 2005 are also incorporated by reference.

BACKGROUND OF THE INVENTION

The present invention relates to semiconductor light emitting devices, and more particularly relates to vertical cavity surface emitting semiconductor laser devices.

In these years, semiconductor light emitting devices such as semiconductor laser devices are in increasing demand as light sources for optical recording, optical communication, and the like. In particular, vertical cavity surface emitting semiconductor laser devices are considered promising as low-power, low-cost light emitting devices because of their features; vertical cavity surface emitting semiconductor laser devices have low threshold current, and a circular beam spot which facilitates direct connection thereof to optical fibers, and vertical cavity surface emitting semiconductor laser devices can be tested in the form of a wafer.

A known vertical cavity surface emitting laser device has a structure in which an active layer having a multiple quantum well structure is interposed between an n-type mirror formed of an n-type semiconductor multilayer film and a p-type mirror formed of a p-type semiconductor multilayer film (see, for example, Japanese Laid-Open Publication No. 2003-188471). Light produced in the active layer is transmitted from inside the cavity formed of the n-type mirror and the p-type mirror and then emitted externally through an opening formed close to the p-type mirror.

However, the conventional vertical cavity surface emitting semiconductor laser device has a problem in that the polarization mode thereof is not stable. Light emitted from a semiconductor laser device has three modes: longitudinal mode, transverse mode, and polarization mode. Of these modes, stabilization of the polarization mode is critical in applying a vertical cavity surface emitting laser device to optical communication. Nevertheless, in the conventional vertical cavity surface emitting semiconductor laser device having a symmetric device structure, a large gain difference cannot be obtained between the orthogonally polarized waves. This causes instability of the polarization mode, such that subtle changes in external conditions such as temperature and driving current easily lead to polarization-direction switching. As a result, in optical communication, excess noise and mode competition are likely to occur, whereby the number of errors is increased and the transmission bandwidth is limited.

The conventional vertical cavity surface emitting semiconductor laser device has another problem. Since the p-type mirror is formed of a semiconductor multilayer film having a heterojunction, valence band spike occurring at the heterojunction interface restricts the electrical conduction of the holes, and therefore a very large voltage has to be applied for operation of the vertical cavity surface emitting laser. The p-type mirror is particularly required to be processed into a post structure and thus has a small cross-sectional area, which significantly increases the series resistance of the device. If the device has a high series resistance, the laser modulation bandwidth is limited, constituting an impediment to the application of the device to high-speed optical communication. In addition, high resistance leads to the problem of generation of heat in the p-type mirror. Heat generated in the p-type mirror is not released sufficiently due to the small cross-sectional area of the p-type mirror. As a result, the luminous efficiency of the laser decreases, thereby making high-speed modulation operation difficult.

SUMMARY OF THE INVENTION

It is therefore an object of the present invention to overcome the above problems and realize a semiconductor light emitting device applicable to high-speed optical communication, which emits light whose polarization mode is stable, and has a wide laser modulation bandwidth.

In order to achieve the object, the inventive semiconductor light emitting devices include a resin film for planarizing a mesa and a metal film having openings formed therein.

More specifically, an inventive semiconductor light emitting device includes: a cavity including a mesa formed over a substrate, the mesa having an active layer and being isolated by a recess formed around the mesa; a resin layer with which the recess is filled; and a metal film formed over a light output surface of the cavity and having an opening formed therein, wherein light emitted from the active layer is output through the light output surface, and the opening has a diameter smaller than an emission wavelength of the emitted light.

The inventive semiconductor light emitting device emits light in which the TM-wave component ratio is high. In addition, the resistance value of the light emitting device is lowered, which enables the operating voltage to be reduced. Moreover, since the resin layer with which the recess is filled is provided, the semiconductor light emitting device can have its parasitic capacitance reduced, thereby allowing modulation operation at high speed. As a result, the semiconductor light emitting device has stabilized polarization mode and is thus applicable to high-speed optical communication.

In the inventive semiconductor light emitting device, two or more said openings are preferably formed and arranged periodically.

In the inventive semiconductor light emitting device, the diameter of the opening is preferably smaller than or equal to one-half of the emission wavelength.

In the inventive semiconductor light emitting device, the light output through the light output surface is preferably a laser beam, and in the laser beam, the value of a ratio of intensity of a TM wave component to intensity of a TE wave component is preferably greater than or equal to two. By this structure, the semiconductor light emitting device in which the polarization directions are stable is realized reliably, even when external conditions such as temperature and driving current are varied.

In the inventive semiconductor light emitting device, in the metal film, the openings are preferably arranged in a lattice.

In the inventive semiconductor light emitting device, relation in $P = \lambda \times (i^2+j^2)^{0.5}/(\in_1 \in_2/(\in_1 + \in_2))^{0.5}$ is preferably satisfied where P is an opening period of the openings, $\in_1$ is a dielectric constant of the metal film, $\in_2$ is a dielectric constant of a material of a layer that is in contact with the metal film, and i and j are integers that are not negative. By this structure, energy conversion between light and a surface plasmon is performed effectively, resulting in an increase in the light output of the semiconductor light emitting device.

In the inventive semiconductor light emitting device, in the metal film, the openings are preferably arranged in a triangular lattice or a hexagonal lattice. This permits the density of the openings to be increased, thereby increasing the light transmittance of the metal film.

In the inventive semiconductor light emitting device, a planar shape of the opening is preferably anisotropic. This allows the refractive index distribution to be asymmetric in the light emitting surface. Consequently, the cavity gain is varied according to the polarization direction, whereby the polarization control is facilitated.

In the inventive semiconductor light emitting device, the metal film preferably has a thickness of from 100 nm to 500 nm. This enables the TE wave component to be attenuated at a higher rate, while keeping the transmittance of the TM wave component at a high level.

In the inventive semiconductor light emitting device, the metal film is preferably made of silver, gold, or aluminum. Also, the metal film is preferably formed of two layers made of different materials. In this case, of the two layers of the metal film, the upper layer is preferably thinner than the lower layer, and the lower layer is preferably made of silver, gold, or aluminum. Also, of the two layers of the metal film, the lower layer is preferably made of silver and the upper layer is preferably made of gold. In the semiconductor light emitting device thus formed, conversion from light to surface plasmon is facilitated.

The inventive semiconductor light emitting device preferably further includes an intermediate layer formed on a surface of the metal film which is located closer to the active layer. This structure prevents the semiconductor layer from being damaged in the metal film formation step and the like.

In the inventive semiconductor light emitting device, the intermediate layer preferably has a thickness for correcting phase change caused when the emitted light is reflected by the metal film. By this structure, phase shift in the light reflected by the metal film is suppressed, thereby realizing a reflector having a high reflectivity. In this case, relation in $0.6 \times \lambda/n \times (\frac{1}{4}+\frac{1}{2}i) \leq d \leq \lambda/n \times (\frac{1}{4}+\frac{1}{2}i)$ is preferably satisfied where d is the thickness of the intermediate layer, n is a refractive index of the intermediate layer, $\lambda$ is the wavelength of the emitted light, and i is an integer that is not negative.

In the inventive semiconductor light emitting device, the intermediate layer is preferably a dielectric film. In this case, the dielectric film is preferably a single-layer film made of one element, or a multilayer film made of two or more elements, the one element and the two or more elements being selected from the group consisting of silicon oxide, silicon nitride, aluminum oxide, titanium oxide, and tantalum oxide.

In the inventive semiconductor light emitting device, the intermediate layer is preferably a transparent conductive film. By this structure, the contact resistance can be reduced without causing a decrease in the luminous efficiency. In this case, the transparent conductive film is preferably made of indium tin oxide (ITO), zinc oxide, or tin oxide.

In the inventive semiconductor light emitting device, the intermediate layer is preferably a semiconductor multilayer film.

The inventive semiconductor light emitting device preferably further includes two reflectors provided to a side of the active layer which is located closer to the light output surface and to a side of the active layer which is located opposite to the light output surface. The metal film preferably functions as the reflector provided to the side closer to the light output surface.

In the inventive semiconductor light emitting device, the reflector provided to the side closer to the light output surface preferably includes a first semiconductor multilayer film formed on a surface of the metal film which is located closer to the active layer.

In the inventive semiconductor light emitting device, the number of periods in the first semiconductor multilayer film is preferably adjusted according to a reflectivity of the metal film. In this case, the number of periods in the first semiconductor multilayer film is preferably from nine to twenty-two. In the semiconductor light emitting device thus formed, the reflectivity of the reflector is allowed to be increased, while the resistance value of the device is suppressed.

In the inventive semiconductor light emitting device, the reflectors preferably have a reflectivity of from 99.4% to 99.9%. This enables the light output to be increased.

In the inventive semiconductor light emitting device, the reflector provided to the side opposite to the light output surface is preferably a reflector formed of a second semiconductor multilayer film.

The inventive semiconductor light emitting device preferably further includes an upper layer formed on a surface of the metal film which opposes the surface of the metal film that is located closer to the active layer. This structure permits occurrence of a surface plasmon resonance at the interface between the metal film and the upper layer as well, which allows the surface plasmon to be effectively reconverted into light. In addition, the upper layer protects the metal film.

The inventive semiconductor light emitting device preferably further includes: a first protective layer formed between the resin layer and side and bottom faces of the recess; a second protective layer for covering an upper surface of the resin layer; and an electrode, formed on the second protective layer, for injecting current into the active layer. By this structure, the parasitic capacitance caused by the electrode is reduced reliably.

In the inventive semiconductor light emitting device, the resin layer is preferably completely surrounded by the first and second protective layers.

In the inventive semiconductor light emitting device, the first and second protective layers are each preferably made of $SiO_2$, $SiN$, $SiON$, $Nb_2O_5$, $ZrO_2$, or $Ta_2O_5$.

In the inventive semiconductor light emitting device, at least part of the resin layer is preferably located higher than an upper surface of the mesa. This permits the thickness of the resin layer to be increased, thereby allowing the parasitic capacitance to be decreased further.

In the inventive semiconductor light emitting device, the upper surface of the resin layer and an upper surface of the mesa are preferably connected with no level difference formed therebetween. By this structure, the processing accuracy in forming the minute opening in the metal film can be increased. In addition, a break in the electrode is also prevented.

In the inventive semiconductor light emitting device, a relative dielectric constant of the resin layer is preferably smaller than or equal to three. In this case, the resin layer is preferably made of benzocyclobutene resin.

The inventive semiconductor light emitting device preferably further includes a current confinement layer provided in the mesa between the active layer and the metal film and including a high-resistance region and a current confinement region, the high-resistance region being a selectively oxidized region or a region into which protons have been injected selectively, the current confinement region being surrounded by the high-resistance region. In this case, the current confinement region preferably has a diameter of 10 μm or smaller.

By this structure, the relaxation oscillation frequency is increased, thereby enabling the modulation bandwidth to be increased.

In the inventive semiconductor light emitting device, the diameter of the mesa is preferably adjusted so that the volume of the mesa is greater than or equal to one-half of the volume of the entire device. By this structure, the effect of the parasitic capacitance other than in the mesa is relatively reduced, which decreases the product of the capacitance value and the resistance value in the entire device, thereby enabling high-speed modulation.

In the inventive semiconductor light emitting device, the side faces of the mesa are preferably inclined. By this structure, stress applied to the resin layer that is in contact with the first protective layer formed on the side faces of the mesa is made uniform. This prevents creation of a gap between the mesa and the resin layer.

BRIEF DESCRIPTION OF THE DRAWINGS

FIG. 1A is a top view of the device, while FIG. 1B is a cross-sectional view thereof taken along the line 1b-1b in FIG. 1A.

DETAILED DESCRIPTION OF THE INVENTION

First Embodiment

Figure 1A:
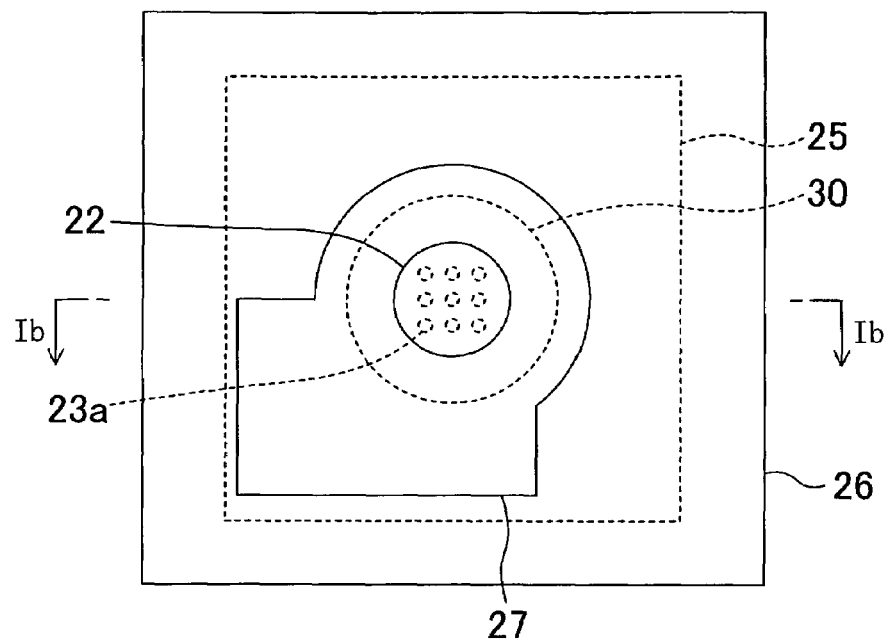
FIGS. 1A and 1B illustrate a semiconductor light emitting device according to a first embodiment of the present invention.
Figure 1B:
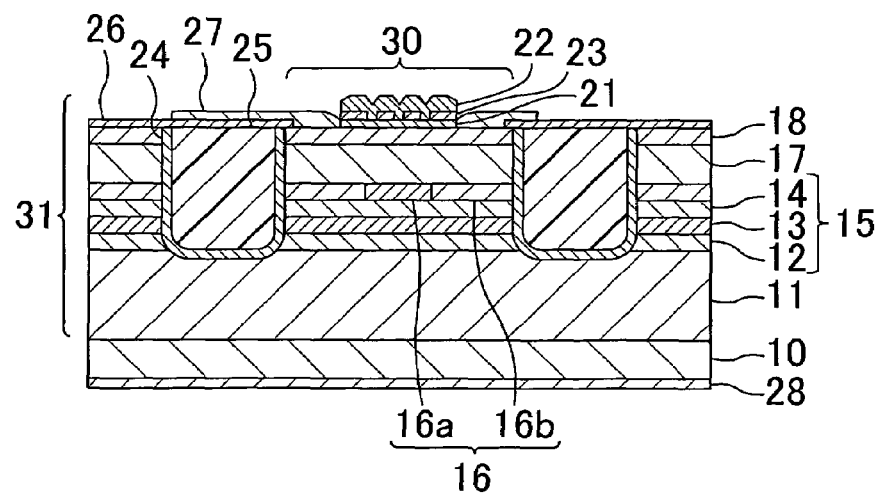

A semiconductor light emitting device according to a first embodiment of the present invention will be described with reference to the accompanying drawings. FIGS. 1A and 1B illustrate a semiconductor light emitting device according to the first embodiment. FIG. 1A illustrates the structure of the device as seen from above, while FIG. 1B illustrates the cross-sectional structure thereof taken along the line 1b-1b in FIG. 1A.

As shown in FIG. 1, a first reflector 11, a lower spacer layer 12, a quantum well layer 13, an upper spacer layer 14, a current confinement layer 16, a second reflector 17, and a p-type contact layer 18 are stacked in this order over a substrate 10 made of n-type GaAs. The first reflector 11 is composed of an n-type semiconductor multilayer film, while the second reflector 17 is formed of a p-type semiconductor multilayer film.

In the multilayer film of the first reflector 11, an n-type $Al_{0.12}Ga_{0.88}As$ layer and an n-type $Al_{0.90}Ga_{0.10}As$ layer are stacked alternately, and silicon is used as the n-type dopant. The thickness of each layer is $\lambda/4n$ ($\lambda$ being the laser oscillation wavelength and n being the refractive index of the medium), and the number of bilayers (i.e., the number of periods) in the multilayer film is 34.5.

In the quantum well layer 13, a well layer formed of a non-doped GaAs layer and a barrier layer composed of an $Al_{0.30}Ga_{0.70}As$ layer are stacked alternately and the number of bilayers (i.e., the number of periods) in the quantum well layer 13 is three. Each of the lower spacer layer 12 and the upper spacer layer 14 is an $Al_{0.30}Ga_{0.70}As$ layer. A quantum well active layer 15, which is composed of the quantum well layer 13, the lower spacer layer 12, and the upper spacer layer 14, has a total thickness of $\lambda/n$ ($\lambda$ being the laser oscillation wavelength and n being the refractive index of the medium).

In the current confinement layer 16, which is formed of a p-type $Al_{0.98}Ga_{0.02}As$ layer, a high-resistance region 16b is formed to surround a current confinement region 16a. The high-resistance region 16b is formed by oxidation, and current flows through the current confinement region 16a. The second reflector 17 is a multilayer film, in which an $Al_{0.12}Ga_{0.88}As$ layer and an $Al_{0.90}Ga_{0.10}As$ layer, doped with carbon serving as the p-type dopant, are stacked alternately. The number of bilayer periods in the multilayer film of the second reflector 17 is nine. The p-type contact layer 18, which is formed of a p-type GaAs layer, is doped with carbon serving as the p-type dopant at a concentration of $1 \times 10^{19}$ cm$^{-3}$ or higher in order to reduce contact resistance with respect to an upper contact electrode 27.

Part of the device formation region, which is composed of the first reflector 11, the active layer 15, the current confinement layer 16, the second reflector 17, and the p-type contact layer 18, is separated from the other region by a recess formed by performing a selective etching until the first reflector 11 is exposed. In this way, a mesa 30, consisting of the active layer 15, the current confinement layer 16, the second reflector 17, and the p-type contact layer 18, is formed.

On the mesa 30, an intermediate layer 21 made of silicon dioxide (SiO$_2$) and having a thickness of 113 nm is formed on the p-type contact layer 18. On the intermediate layer 21, a metal film 23 made of gold (Au), silver (Ag), or the like and having a thickness of 200 nm is formed. In the metal film 23, a plurality of openings 23a each having a diameter smaller than the oscillation wavelength of the laser beam are formed periodically. The metal film 23 is covered with an upper layer 22 made of silicon nitride (SiN) and having a thickness of 200 nm, whereby the metal film 23 is prevented from deteriorating and surface plasmon excitation conditions are also satisfied at the interface between the upper surface of the metal film 23 and the upper layer 22. This enables effective energy reconversion from surface plasmon to light.

In the semiconductor light emitting device of this embodiment, the metal film 23 and the second reflector 17 function together as an upper reflector, and a cavity region 31 having the mesa 30, in which the active layer 15 is interposed between the first reflector 11 and the metal film 23, is formed A first protective film 24 is formed so as to cover the side walls and bottom face of the recess that surrounds the mesa 30. The first protective film 24 is an inorganic insulating film formed of a SiO$_2$ film, a SiN film, a SiON film, a Nb$_2$O$_5$ film, a ZrO$_2$ film, or a Ta$_2$O$_5$ film. A resin film 25 made of benzocyclobutene (BCB) resin is formed so that the recess covered with the first protective film 24 is filled with the resin film 25. A second protective film 26 is formed so as to cover the upper surface of the resin film 25 and the upper surface of the device formation region except for the central portion of the mesa 30. The resin film 25 is surrounded by the first and second protective films 24 and 26.

On the upper surface of the second protective film 26, the upper contact electrode 27 is formed so as to be partially in contact with the p-type contact layer 18, while a lower contact electrode 28 is formed on the lower surface of the substrate 10. Upon application of a bias voltage across the upper contact electrode 27 and the lower contact electrode 28, the current injected through the portion of the upper contact electrode 27 that is in contact with the p-type contact layer 18 is confined within the current confinement region 16a in the current confinement layer 16, and then injected into the quantum well layer 13 where carrier recombination occurs. As a result, the light emitted in the quantum well layer 13 oscillates to become a laser beam in the cavity region 31 formed between the lower reflector formed of the first reflector 11 and the upper reflector composed of the second reflector 17 and the metal film 23. In the semiconductor light emitting device of this embodiment, the oscillation wavelength is about 850 nm.

In the semiconductor light emitting device of this embodiment, when the light coming from inside the cavity region 31 reaches the metal film 23, the light is easily converted into a surface plasmon, because the openings 23a are periodically formed in the metal film 23. The excited surface plasmon is reconverted into light and the light is emitted outside the cavity region 31. As a result, light transmission that is several orders of magnitude larger than the transmittance determined by the area of the openings 23a occurs, which enables the laser beam to be emitted externally through the metal film 23.

Figure 2:
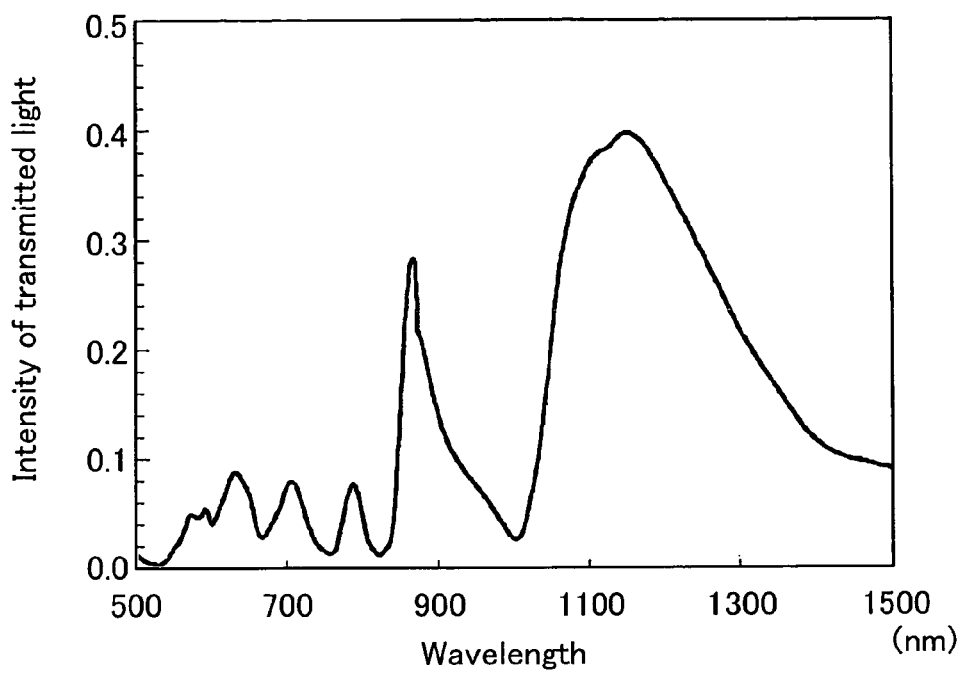
FIG. 2 is a graph indicating the optical transparency of a metal film used in the semiconductor light emitting device of the first embodiment of the present invention.

FIG. 2 illustrates results of examination of light emission through a metal film having openings therein. In FIG. 2, the horizontal axis indicates the wavelength of the light incident onto the metal film, while the vertical axis represents the intensity of the light that has transmitted through the metal film. The metal film used in FIG. 2 was an Ag film formed on a 113-nm-thick SiO$_2$ film formed on a quartz substrate. In the metal film, the circular openings were formed in the form of a square lattice by electron beam (EB) lithography and by etching, and the metal film was covered by a 200-nm-thick SiN film for protection of the metal film. The metal film had a thickness of 200 nm and the diameter of each opening was 200 nm. An opening period, that is, the center-to-center distance between adjacent openings, was 550 nm.

As shown in FIG. 2, a phenomenon in which light having a wavelength longer than the diameter of the openings also transmitted through the metal film was observed. It is known that when the openings are arranged in the form of a square lattice, the opening period P of the openings that excites a surface plasmon is given by the following equation 1.

$$P = \lambda \times (i^2 + j^2)^{0.5} / (\in_1 \in_2 / (\in_1 + \in_2))^{0.5} \quad \text{(Equation 1)}$$

where i and j are integers higher than or equal to 0, $\in_1$ is the dielectric constant of the metal having the openings formed therein, and $\in_2$ is the dielectric constant of the medium in contact with the metal.

In FIG. 2, the intensity of the transmitted light is maximized when the wavelength is 1150 nm. The dielectric constant of the Ag is −49 and the dielectric constant of the SiN is 4 at a wavelength of 1150 nm. Therefore, from the equation 1, in which it is assumed that i$^2$+j$^2$=1, the opening period P that allows occurrence of a surface plasmon resonance is 550 nm, when the wavelength is 1150 nm. This value agrees with the opening period of the openings formed in the metal film used in the measurements. It is thus clear that the peak of the transmitted light intensity occurring at a wavelength of 1150 nm resulted from the surface plasmon resonance created at the interface between the Ag and the SiN.

In FIG. 2, another peak is observed at a wavelength of 886 nm. This peak was apparently caused by a surface plasmon resonance at the interface between the Ag and the SiO$_2$, because the dielectric constant of the Ag is −33.5 and the dielectric constant of the SiO$_2$ is 2.25 when the wavelength is 886 nm. Furthermore, changes in the peak wavelength, caused when the incident angle of the light incident on the metal film was varied, were examined in detail, and the obtained results supported the involvement of the surface plasmon resonance in the light transmission.

Figure 3:
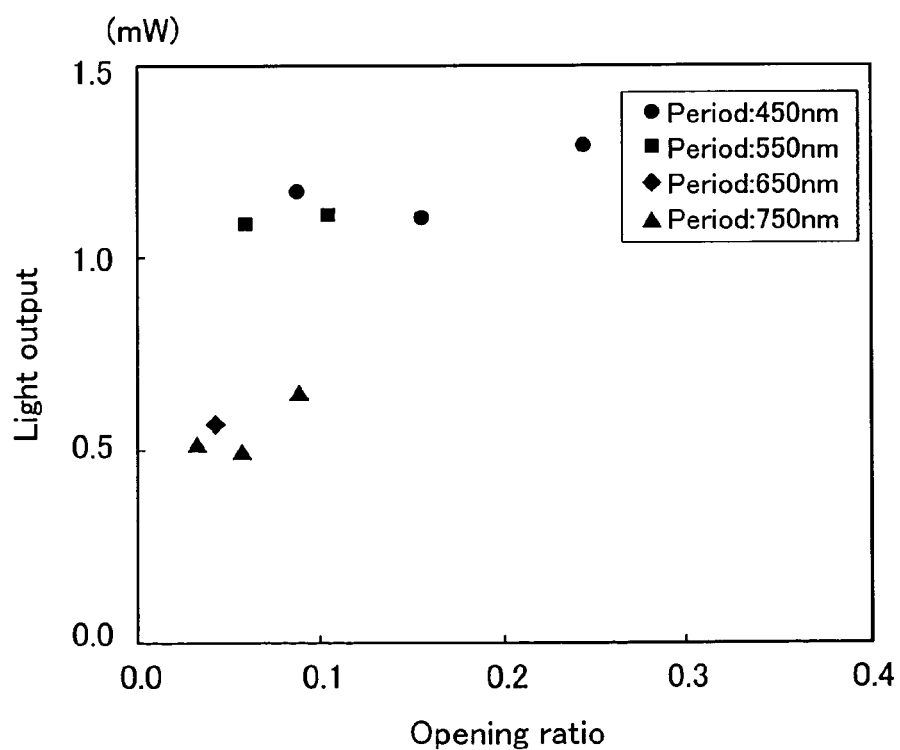
FIG. 3 is a graph indicating relations between the opening period of openings in, and the output of, the semiconductor light emitting device of the first embodiment of the present invention.

FIG. 3 illustrates results of measurements of relations between the opening period of the openings in, and the output of, the semiconductor light emitting device of this embodiment. In FIG. 3, the horizontal axis represents an opening ratio, that is, a ratio between the opening diameter of the openings and the emission wavelength, while the vertical axis indicates the output of the light obtained from the device. In the semiconductor light emitting device used in the measurements, the emission wavelength was about 850 nm, a 200-nm-thick silver film was used as the metal film 23, and a 200-nm-thick film made of SiN was provided as the upper layer 22 to cover the metal film 23. The injected current was 5 mA.

As shown in FIG. 3, when the opening period of the openings is 450 nm and 550 nm, the light output approximately doubles as compared with the cases in which the opening period is 650 nm and 750 nm. From the equation 1, the respective opening periods that satisfy the surface plasmon resonance at the interface between the Ag and the SiN and the surface plasmon resonance at the interface between the Ag and the SiO$_2$ are 450 nm and 550 nm, when the wavelength is 850 nm. Therefore, it is apparent that the light output is improved by the surface plasmon resonance.

Considering the continuity condition for the electric flux density at the interface between the cavity region 31 and the metal film 23, a polarization component of the light that can excite a surface plasmon is a TM wave (transverse magnetic wave) alone, and a TE wave (transverse electric wave) cannot excite any surface plasmon. Therefore, as generally known, the TE wave component is significantly attenuated in the metal film. When a metal film made of Au, Ag or the like and having a thickness of 200 nm is used as in this embodiment, the luminous transmittance of the metal film 23 is extremely small and is $10^{-7}$ or less, such that the light of the TE wave component is hardly emitted outside the cavity region 31. Also, about luminous transmission through openings, the following is known: when the diameter of the openings is smaller than the wavelength, the luminous transmittance is proportional to $(d/\lambda)^4$ where d is the opening diameter. When the opening diameter is small with respect to the wavelength as in this embodiment, the luminous transmittance also becomes small. Consequently, the TE polarized light is hardly emitted externally, and only the TM polarized light that can excite a surface plasmon is emitted externally through the metal film 23.

As described above, the metal film 23 having the periodically formed openings allows the TM wave of the laser beam to be selectively taken outside the cavity region 31, whereby the polarization mode of the laser beam emitted from the vertical cavity surface emitting laser device is controlled.

Figure 4:
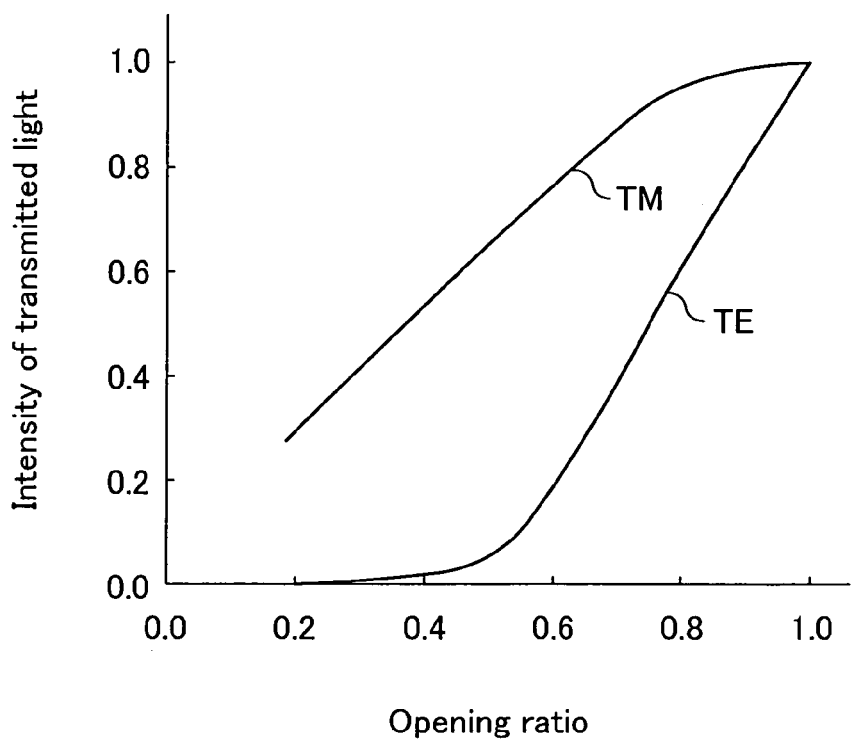
FIG. 4 is a graph indicating relations between the opening ratio of the openings and the luminous transmittance in the semiconductor light emitting device of the first embodiment of the present invention.

FIG. 4 indicates results of simulations of the luminous transmittance of a metal film formed on a glass substrate and having openings. In the simulations, a FDTD (finite difference time domain) method was used. The metal film was an Au film having a thickness of 200 nm and the opening period was 550 nm. The transmittance was calculated for various opening diameters both in a case in which the excitation light was a TE wave and in a case in which the excitation light was a TM wave, whereby the dependence of the light transmittance on the opening ratio was obtained.

As shown in FIG. 4, when the opening ratio is reduced, the light transmittance for the TE polarized light decreases sharply. When the opening ratio is smaller than 0.4, the TE polarized light is cut off. On the other hand, in the case of the TM polarized light, although the light transmittance decreases when the opening ratio is reduced, the light transmission is possible even when the opening ratio is about 0.2. These results indicate that the light transmission via a surface plasmon occurs in the TM polarized light.

Figure 5:
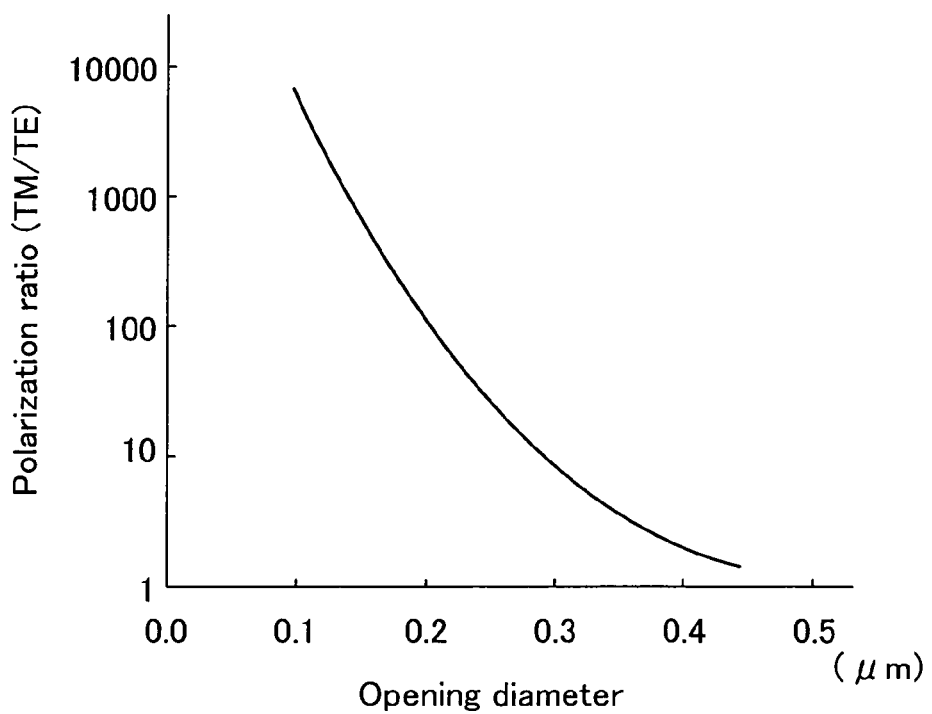
FIG. 5 is a graph indicating relations between the opening diameter of the openings and the polarization ratio of the output light in the semiconductor light emitting device of the first embodiment of the present invention.

FIG. 5 indicates results of simulations of the dependence, on the opening diameter, of a polarization ratio (TM/TE), that is, a ratio between the intensity of TM polarized light and the intensity of TE mode light. As shown in FIG. 5, it is obvious that a larger polarization ratio is obtained by reducing the opening diameter. This is because as the opening diameter is made smaller, the light transmission through the openings decreases, thereby making the effects of the light transmission via a surface plasmon more significant.

The above results show that by making the opening diameter of the openings smaller than or equal to the emission wavelength, the polarization mode can be controlled in such a manner that the intensity of the TM wave component is higher than the intensity of the TE wave component. Also, by making the opening diameter smaller than or equal to one-half of the emission wavelength, a semiconductor light emitting device in which the polarization ratio is higher than or equal to two and which is thus generally suitable for optical communication is obtained.

Figure 6:
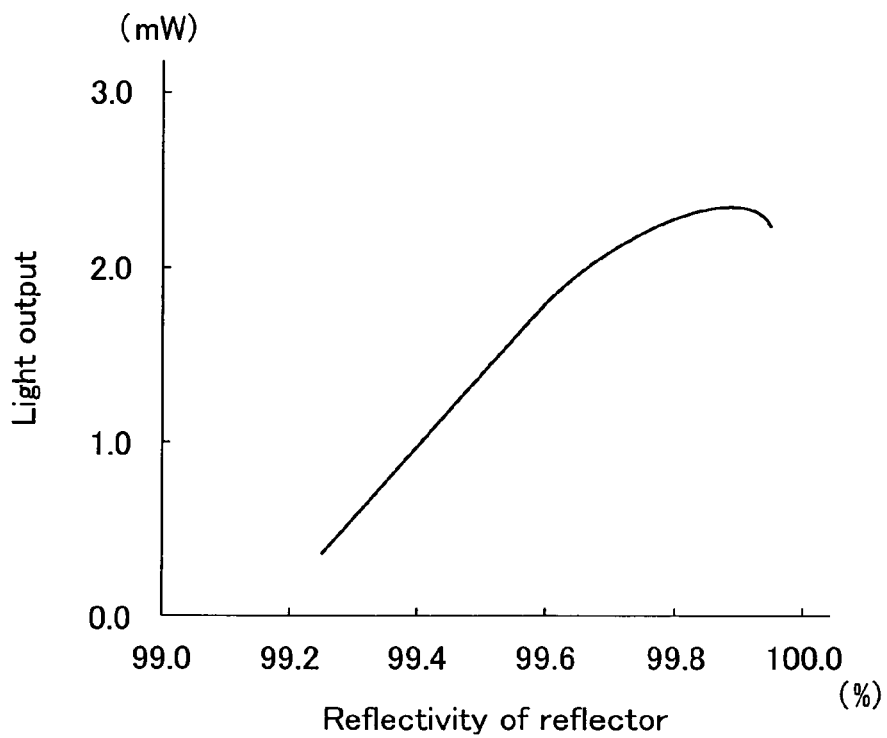
FIG. 6 is a graph indicating relations between the reflectivity of an upper reflector in, and the light output of, the semiconductor light emitting device of the first embodiment of the present invention.

Since a vertical cavity surface emitting laser typically has a short cavity length, the reflector provided closer to the light emitting surface thereof is also required to have a reflectivity as high as 99% or more in order to obtain laser oscillation. FIG. 6 indicates calculation results obtained by simulating the light output of the semiconductor light emitting device of this embodiment. The calculations were performed assuming that the injected current was 5 mA. As shown in FIG. 6, it is clear that higher light output is obtained by increasing the reflectivity of the reflector located close to the light emitting surface. For example, in the case of an injected current of 5 mA, in order to obtain a light output of 1 mW or higher, the reflectivity of the reflector located close to the light emitting surface must be 99.4% or higher. On the other hand, FIG. 6 shows that the output light reaches a maximum when the reflectivity is 99.9% and that when the reflectivity exceeds this level, the light output decreases.

In order to obtain such a high reflectivity, it is effective to combine a reflector formed of a metal film and a reflector formed of a semiconductor multilayer film. Achieving such a high reflectivity only by a reflector formed of a semiconductor multilayer film requires the number of periods in the semiconductor multilayer film to be from 20 to 25. If a reflector composed of a semiconductor multilayer film having such a large number of periods is provided, the device resistance of the semiconductor light emitting device will increase. However, in the semiconductor light emitting device of this embodiment, the metal film 23 and the second reflector 17 composed of the semiconductor multilayer film are combined, which allows the number of periods in the multilayer film of the second reflector 17 to be as small as about nine. Therefore, increase in the device resistance of the semiconductor light emitting device is prevented, thereby enabling the device to operate at high speed. In addition, since the thermal resistance of metal is extremely small, any heat produced in the metal film 23 can be effectively released externally, whereby the device diffuses heat more effectively.

Since the reflectivity of the metal film 23 varies depending upon the material of the metal film 23, the diameter of the openings 23a, and other structure parameters, the number of periods in the second reflector 17 may be established accordingly. More specifically, the number of periods in the second reflector 17 may be set from 9 to 22.

In this embodiment, the thickness of the intermediate layer 21 is 113 nm. By making the thickness of the intermediate layer 21 about 0.8 times the ¼n fraction (n being the refractive index of the intermediate layer) of the emission wavelength $\lambda$, the Bragg condition of the reflector formed of the metal film 23, the intermediate layer 21, and the second electrode 17 is satisfied. Therefore, it is possible to compensate for phase changes caused by optical absorption by the metal film 23, whereby the reflectivity of the reflector composed of the metal film 23, the intermediate layer 21, and the second electrode 17 is maximized.

Figure 7:
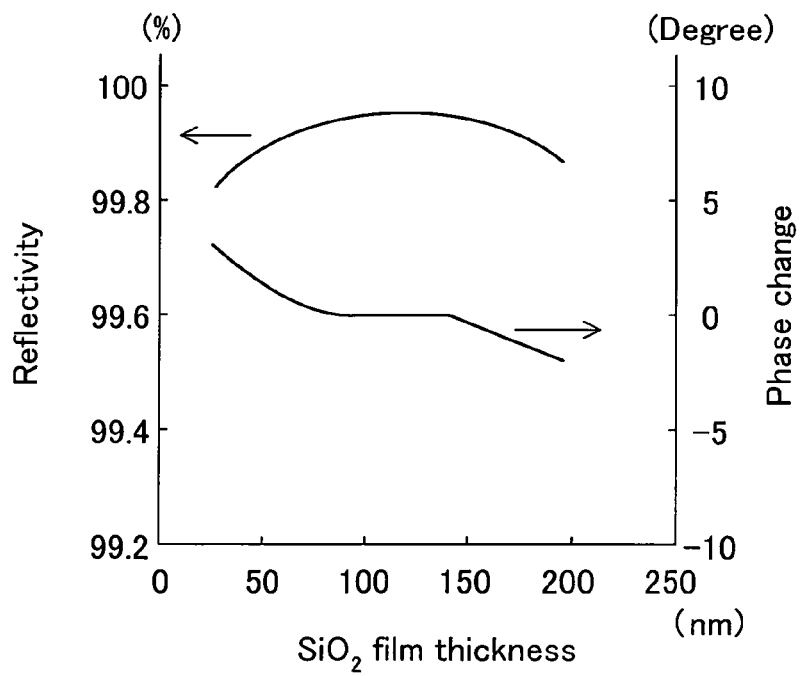
FIG. 7 is a graph indicating relations between the mesa width and the modulation bandwidth in the semiconductor light emitting device of the first embodiment of the present invention as compared with a conventional device.

FIG. 7 indicates calculation results of the dependence, on the $SiO_2$ film thickness, of the reflectivity and the phase change observed when light at the Bragg wavelength is incident on a reflector composed of Au and $SiO_2$ films and a semiconductor multilayer film in which the number of periods is nine. As shown in FIG. 7, when the thickness is 113 nm, that is, when $0.8 \times \lambda/(4n)$, the reflectivity is maximized. Also, in the range in which the thickness of the $SiO_2$ film is from 85 nm $(0.6 \times \lambda/(4n))$ to 142 nm $(\lambda/(4n))$, phase change in the reflected light is suppressed, allowing the reflectivity to be high.

The intermediate layer 21 may be made of transparent conductive material such as ITO (indium tin oxide), zinc oxide, or tin oxide. Then, an electrode can be formed on the mesa 30 as well, whereby a semiconductor light emitting device having a low contact resistance is realized. Moreover, the intermediate layer 21 may be formed as a dielectric multilayer film or a semiconductor multilayer film so as to function as a reflective film.

In the semiconductor light emitting device of this embodiment, since the second reflector 17 is formed to have a small thickness, the height of the mesa 30 is low. Generally, when the distance between the upper contact electrode 27 and the first reflector 11 is made shorter, the parasitic capacitance of the device increases. However, in the semiconductor light emitting device of this embodiment, the recess that forms the mesa 30 is filled with the resin film 25 that is made of a BCB resin having a low dielectric constant. Therefore, the parasitic capacitance produced between the upper contact electrode 27 and the first reflector 11 is decreased.

In addition, by filling the recess with the resin film 25, it is possible to eliminate the step structure around the mesa 30, which allows formation of a flat resist, when the openings 23a are formed in the metal film 23. As a result, the metal film 23 is formed with the openings 23a whose opening diameter and opening period are highly accurate and repetitive. Furthermore, it is also possible to prevent a break in the upper contact electrode 27 which would otherwise be caused by the step.

Figure 8:
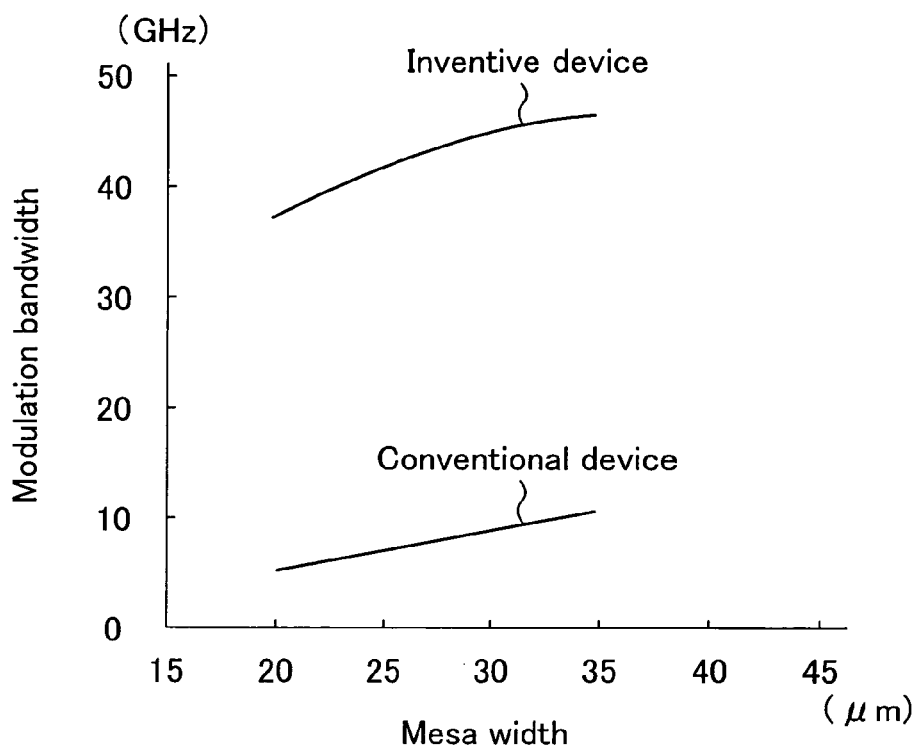
FIG. 8 is a graph indicating relations between the aperture diameter and the modulation bandwidth in the semiconductor light emitting device of the first embodiment of the present invention.

FIG. 8 indicates results of estimation of the modulation bandwidths of laser devices, which are restricted by the parasitic capacitance and the series resistance. The 3 dB modulation bandwidth of the conventional laser device is about 10 GHz, while in the semiconductor light emitting device of this embodiment, the modulation bandwidth is increased by more than a factor of four. This modulation bandwidth increase is achieved because in the semiconductor light emitting device of this embodiment, the series resistance is lowered by the absence of an upper multilayer film reflector, and the parasitic capacitance is also decreased by the presence of the buried low dielectric constant material. In FIG. 8, when the width of the mesa is 22 μm or greater, the high modulation bandwidth exceeding 40 GHz is obtained. The reason why the increased diameter of the mesa permits the modulation bandwidth to be improved is because the effect of the parasitic capacitance other than in the mesa is relatively reduced to decrease the product of the capacitance and the resistance in the entire device.

Figure 9:
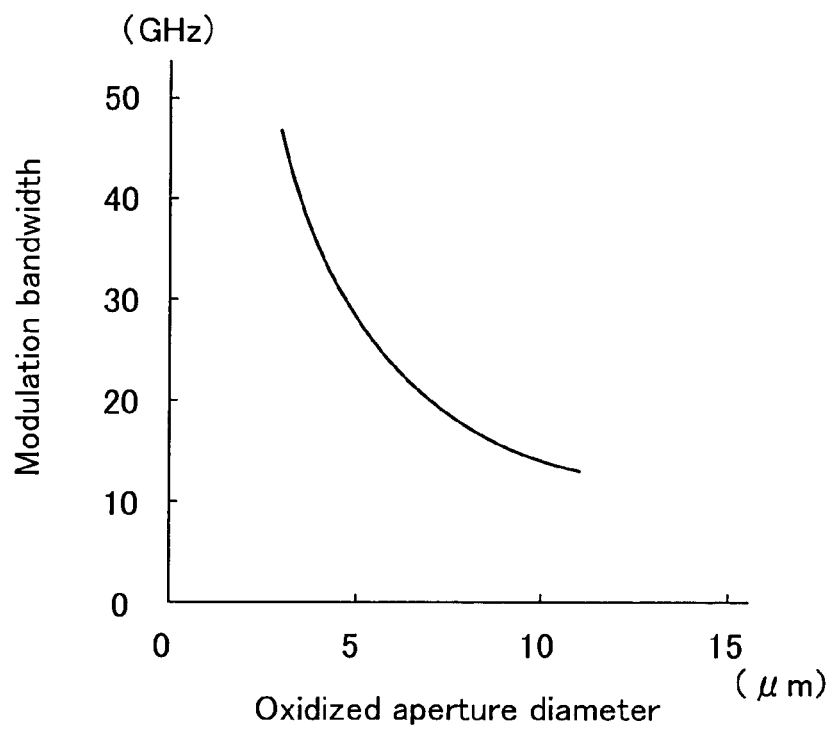
FIG. 9 is a graph indicating relations among the thickness of an intermediate layer, reflectivity, and phase changes in the semiconductor light emitting device of the first embodiment of the present invention.

As a cause restricting the modulation bandwidth of the laser, relaxation oscillation frequency has to be considered. Since the relaxation oscillation frequency is inversely proportional to the square-root of the volume of the laser cavity, it is preferable that the width of the current confinement region 16a (i.e., the oxidized aperture diameter) in the current confinement layer 16 be reduced. FIG. 9 indicates results of estimation of the dependence, on the oxidized aperture diameter, of the modulation bandwidth restricted by the relaxation oscillation frequency. In the estimation, the optical output was 2 mW. The modulation bandwidth was increased as the oxidized aperture diameter was decreased. As shown in FIG. 9, by making the oxidized aperture diameter smaller than or equal to 10 μm, the high modulation bandwidth greater than or equal to 15 GHz was achieved.

Although in the exemplary case described above, gold or silver is used as the metal film 23, other material such as aluminum may alternatively be used. Furthermore, the metal film 23 may be a multilayer film. For instance, the metal film 23 may be formed by stacking a 50-nm-thick first metal film made of Ag and a 150-nm-thick second metal film made of Al in this order. The use of Ag for the first metal film permits a surface plasmon to occur effectively, while the presence of the Al second metal film in the upper position prevents the Ag from undergoing oxidation. Alternatively, a combination of Au and Ag, for example, may also be used. In that case, the upper film is preferably made thinner than the lower film.

Also, in the foregoing description, the exemplary case in which the thickness of the metal film 23 is 200 nm has been described. However, if the thickness is 100 nm or greater, it is possible to sufficiently attenuate the TE wave component, and in order to prevent the TM wave component from being attenuated, the thickness is preferably 500 nm or less.

The planar shape of the openings 23a formed in the metal film 23 is not limited to a circle, but may be an anisotropic shape such as an ellipse, a rectangle, or the like. If the planar shape of the openings 23a is anisotropic, the refractive index distribution in the metal film 23 becomes asymmetric. It is therefore possible to change the cavity gain according to the polarization direction, thereby facilitating the polarization control.

In addition, the arrangement of the openings 23a is not limited to a square lattice, but may be a triangular lattice or a hexagonal lattice. If the openings 23a are arranged in the form of a triangular lattice or a hexagonal lattice, it is possible to increase the density of the openings and hence the light transmittance.

Moreover, although the intermediate layer 21 is provided between the metal film 23 and the p-type contact layer 18 in this embodiment, the metal film 23 may be formed directly on the p-type contact layer 18 without forming the intermediate layer 21. In that case, since the medium that is in contact with the metal film is GaAs, the opening period of the openings 23 must be changed.

For example, when the emission wavelength is 850 nm, the dielectric constant of GaAs is 13.3, in which case the opening period P may be set to 180 nm.

Also, although in the above-described exemplary case, the upper layer 22 is formed to cover the metal film 23, the formation of the upper layer 22 is not necessarily required. Furthermore, the upper layer 22 and the intermediate layer 21 may be made of the same material. In addition, in order to produce a surface plasmon resonance at the interface between the metal film 23 and the upper layer 22, the upper layer 22 does not have to cover the side faces of the metal film 23.

Although the resin film 25 is made of a BCB resin in this embodiment, SiLK™, fluorinated polyarylene ether resin or the like may alternatively be used. Also, when the mesa 30 is formed, it is preferable that the side faces of the mesa 30 be inclined. By slanting the side faces of the mesa 30, stress applied to the resin film 25 that is in contact with the first protective film 24 formed on the side faces of the mesa 30 is made uniform. This prevents creation of a gap between the mesa 30 and the resin film 25, thereby increasing the reliability of the semiconductor light emitting device.

Second Embodiment

Figure 10:
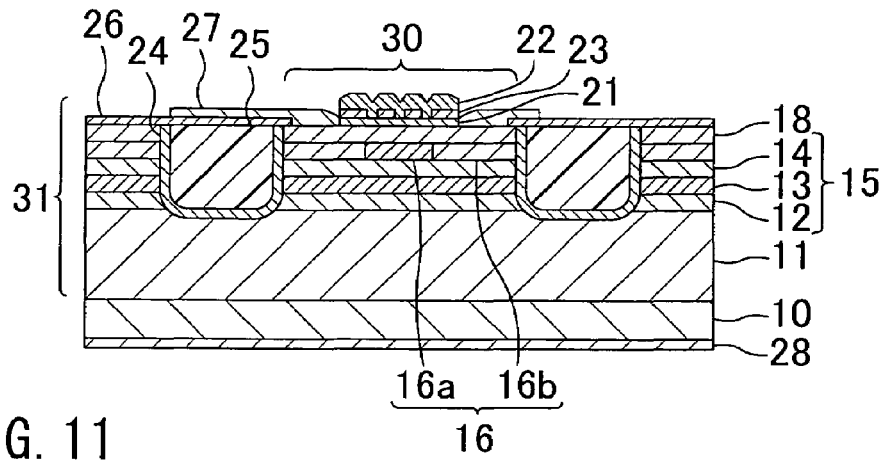
FIG. 10 is a cross-sectional view illustrating a semiconductor light emitting device according to a second embodiment of the present invention.

Hereinafter, a semiconductor light emitting device according to a second embodiment of the present invention will be described with reference to the accompanying drawings. FIG. 10 illustrates a cross-sectional structure of the semiconductor light emitting device of the second embodiment. In FIG. 10, the same members as those shown in FIG. 1 are identified by the same reference numerals and the descriptions thereof will be thus omitted herein.

In the semiconductor light emitting device of this embodiment, a second reflector 17 is not provided so that an upper reflector is formed of a metal film 23 alone. The semiconductor light emitting device of this embodiment having no second reflector 17 can thus have its resistance decreased significantly.

On the other hand, in the semiconductor light emitting device of this embodiment, the parasitic capacitance might be increased, because a mesa 30 is very small in height. In that case, a resin film 25 may be formed to have a larger thickness as required, so as to be greater in height than the upper surface of the mesa 30, thereby enabling the parasitic capacitance to be reduced.

Third Embodiment

Figure 11:
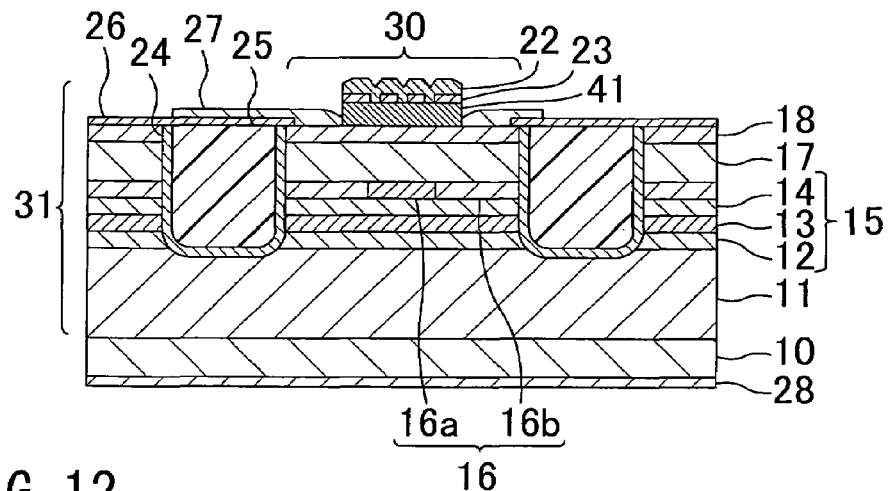
FIG. 11 is a cross-sectional view illustrating a semiconductor light emitting device according to a third embodiment of the present invention.

Hereinafter, a semiconductor light emitting device according to a third embodiment of the present invention will be described with reference to the accompanying drawings. FIG. 11 illustrates a cross-sectional structure of the semiconductor light emitting device of the third embodiment. In FIG. 11, the same members as those shown in FIG. 10 are identified by the same reference numerals and the descriptions thereof will be thus omitted herein.

As shown in FIG. 11, in the semiconductor light emitting device of this embodiment, a dielectric multilayer film 41 is formed under a metal film 23. Since the metal film 23 and the dielectric multilayer film 41 together form a reflector, the reflector has an increased reflectivity as compared with cases in which only the metal film 23 is provided. In addition, since the metal film 23 is not formed on a semiconductor layer, the effect of preventing alloying of the metal film 23 is also achieved.

Fourth Embodiment

Figure 12:
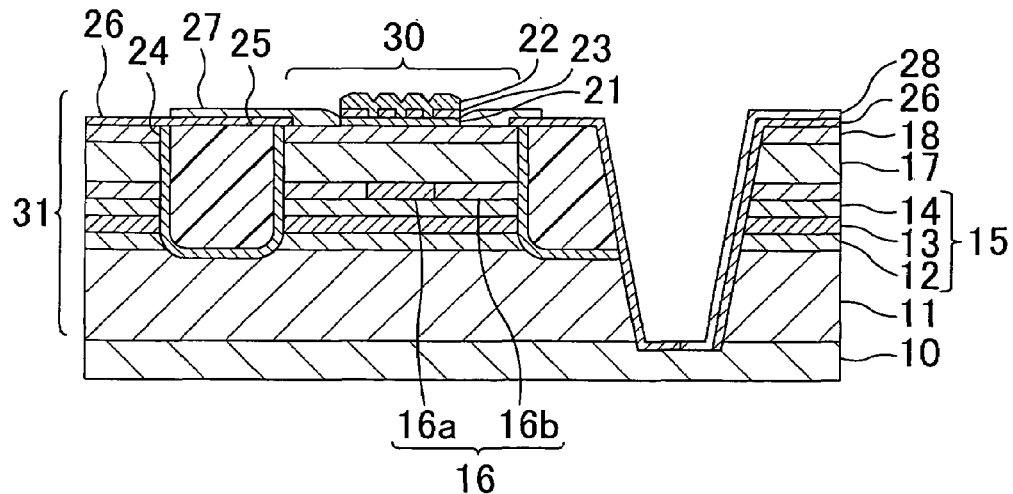
FIG. 12 is a cross-sectional view illustrating a semiconductor light emitting device according to a fourth embodiment of the present invention.

Hereinafter, a semiconductor light emitting device according to a fourth embodiment of the present invention will be described with reference to the accompanying drawings. FIG. 12 illustrates a cross-sectional structure of the semiconductor light emitting device of the fourth embodiment. In FIG. 12, the same members as those shown in FIG. 1 are identified by the same reference numerals and the descriptions thereof will be thus omitted herein.

As shown in FIG. 12, in the semiconductor light emitting device of this embodiment, a contact hole for exposing a substrate 10 is formed so that a lower contact electrode 28 is extended to the upper surface of the device. This structure allows the formation of wiring on the same side of the substrate, thereby increasing the mounting efficiency of the semiconductor light emitting device.

The formation of the contact hole increases the surface roughness of the semiconductor light emitting device. However, by adjusting the thickness of the resin film 25, it is possible to planarize the upper contact electrode 27 and the lower contact electrode 28, i.e., it is possible to eliminate level difference between the upper contact electrode 27 and the lower contact electrode 28.

In the exemplary cases described in the foregoing embodiments, metal films are provided in vertical cavity surface emitting semiconductor lasers. Nevertheless, metal films may be provided likewise, e.g., in Fabry-Perot semiconductor lasers, solid state lasers, gas lasers, and other laser devices. In those cases, effects similar to those described in the foregoing embodiments are attainable.

Fifth Embodiment

Hereinafter, a method for fabricating a semiconductor light emitting device according to a fifth embodiment of the present invention will be described with reference to the accompanying drawings. FIG. 13 illustrates sequential process steps in the semiconductor light emitting device fabrication method of the fifth embodiment.

Figure 13A:
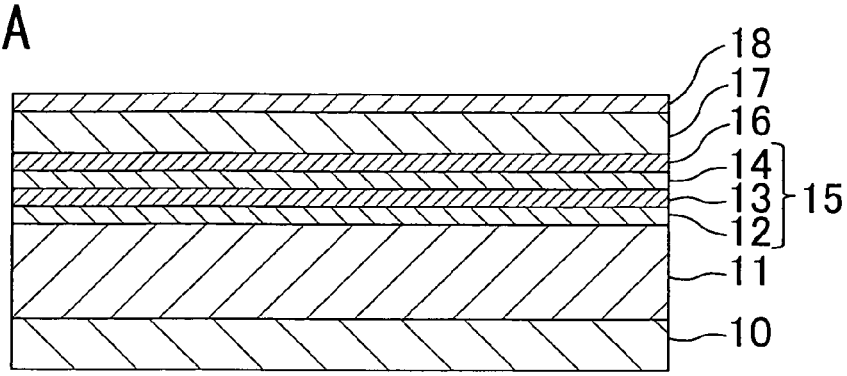
FIG. 13 is a cross-sectional view illustrating sequential process steps for fabricating a semiconductor light emitting device according to a fifth embodiment of the present invention.

As shown in FIG. 13A, crystals of each of a first reflector 11, a quantum well active layer 15, a current confinement layer 16, a second reflector 17, and a p-type contact layer 18 are grown in this order over an n-type GaAs substrate 10 by a metal organic chemical vapor deposition (MOCVD) process, for example. The quantum well active layer 15 is composed of a lower spacer layer 12, a quantum well layer 13, and an upper spacer layer 14. Subsequently, a silicon dioxide film ($SiO_2$ film) is formed over the entire surface of the substrate by a CVD process or a sputtering process, and then a photolithography process and a dry-etching process are performed to make the $SiO_2$ film have a predetermined pattern.

Figure 13B:
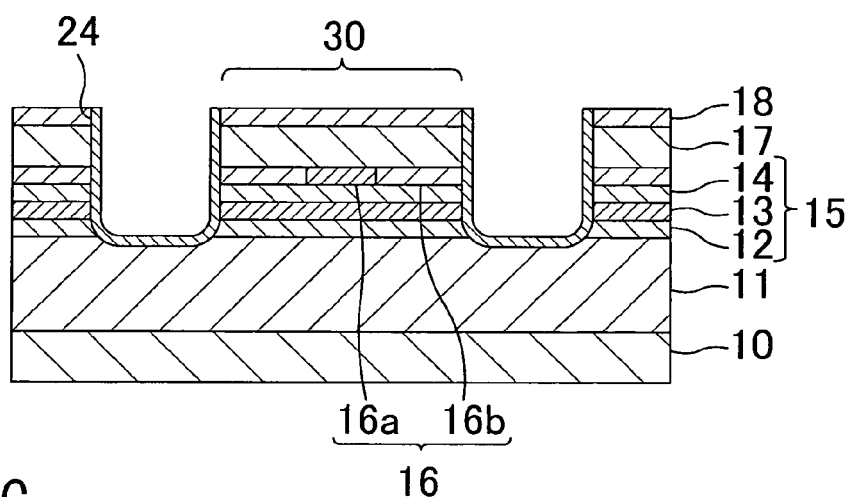

Next, as shown in FIG. 13B, the p-type contact layer 18, the second reflector 17, the current confinement layer 16, the quantum well active layer 15, and part of the first reflector 11 are etched by a dry etching process using the $SiO_2$ film as an etching mask, thereby forming a mesa 30. Since the purpose of this process step is to expose the current confinement layer 16 at the side faces of the mesa 30, the etching does not necessarily have to be performed until the first reflector 11 is reached.

After the formation of the mesa 30, the substrate having the mesa 30 is exposed to a water vapor atmosphere at 400° C. for about 15 minutes, whereby the mesa 30 is oxidized from the outer regions thereof. The oxidation rate in this process step differs depending upon the Al content in each layer; as the Al content is increased, the oxidation rate is also increased. Therefore, by making the Al content in the current confinement layer 16 greater than those in the other layers, the current confinement layer 16 is oxidized at a higher rate than the other layers. Consequently, the current confinement layer 16 is oxidized except for the portion thereof located in the middle of the mesa 30, whereby the current confinement layer 16 that has a current confinement region 16a in the center of the mesa 30 and an oxidized high resistance region 16b in the peripheral portion of the mesa 30 is easily formed.

Figure 13C:
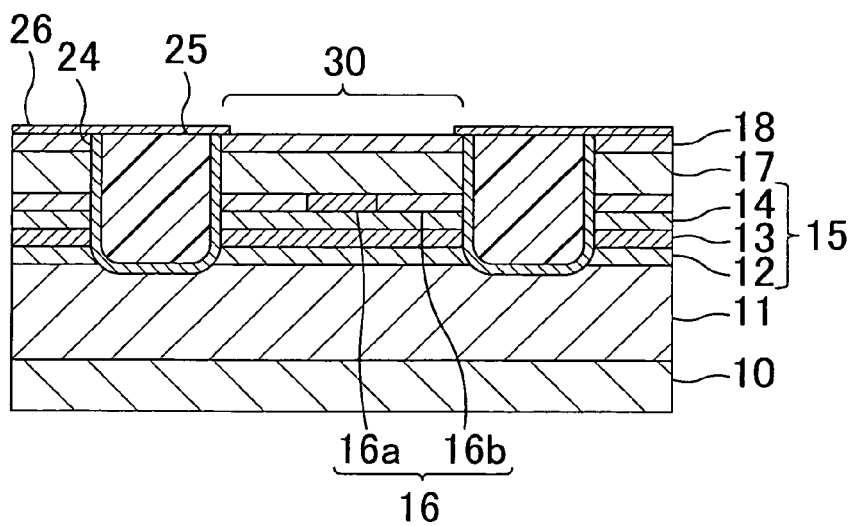

Next, as shown in FIG. 13C, a first protective film 24 made of $SiO_2$ is formed on the upper surface and side faces of the mesa 30 and on the surface of the first reflector 11. Subsequently, a resin film 25 made of a BCB resin is applied on the first protective film 24. The resin film 25 is then heat-treated in a nitrogen atmosphere so as to be cured. A second protective film 26 made of $SiO_2$ is then formed so as to cover the upper surface of the resin film 25 and the upper surface of the mesa 30. Thereafter, the second protective film 26 formed on the upper surface of the mesa 30 is partially removed by a wet-etching process in order to form a contact window, which is required to bring the upper contact electrode 27 and the p-type contact layer 18 into contact with each other.

Figure 14A:
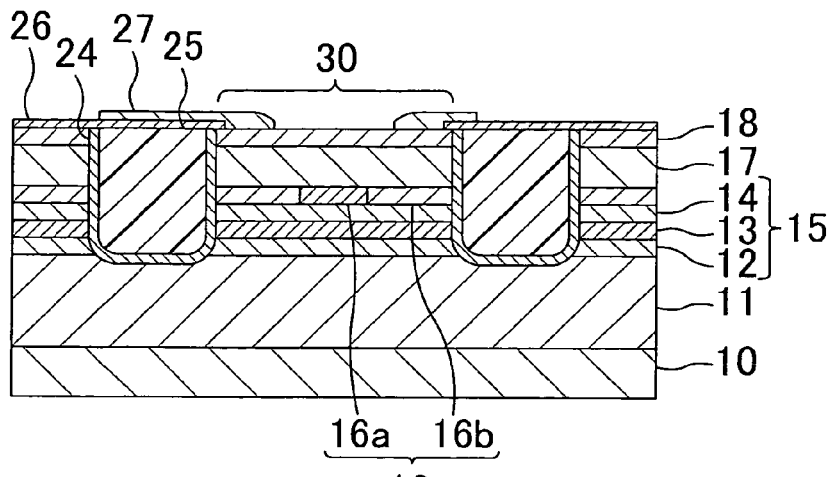
FIG. 14 is a cross-sectional view illustrating sequential process steps for fabricating the semiconductor light emitting device according to the fifth embodiment of the present invention.

Subsequently, as shown in FIG. 14A, a mask having a predetermined configuration is formed in the central portion of the mesa structure by using a photoresist, and Ti, Pt and Au are formed in this order. The photoresist is then removed by a lift-off method, whereby the upper contact electrode 27 having a predetermined shape is formed.

Figure 14B:
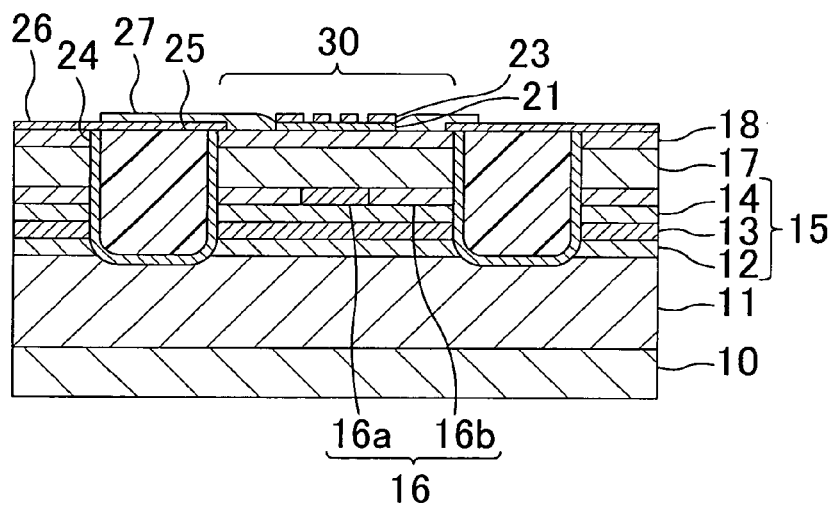

Next, as shown in FIG. 14B, a 113-nm-thick intermediate layer 21 made of $SiO_2$ is formed on the p-type contact layer 18, and then a metal film 23 made of gold and having openings 23a is formed on the intermediate layer 21 by electron-beam evaporation and by lithography.

The opening diameter and opening period of the openings 23a must be formed accurately, and therefore the resist used in the lithography must be flat. In the conventional methods, in order to obtain a flat resist, a metal film having openings is required to be formed before formation of a mesa. However, in the fabrication method of this embodiment, the recess around the mesa 30 is filled with the resin film 25, so that the surface of the region in which the mesa is formed is planarized. Therefore, the flatness of the resist is achieved reliably, which enables the formation of the metal film 23 in which the opening diameter and the opening period are precise. This also prevents the metal film 23 from being damaged in the process step for forming the mesa 30.

Figure 14C:
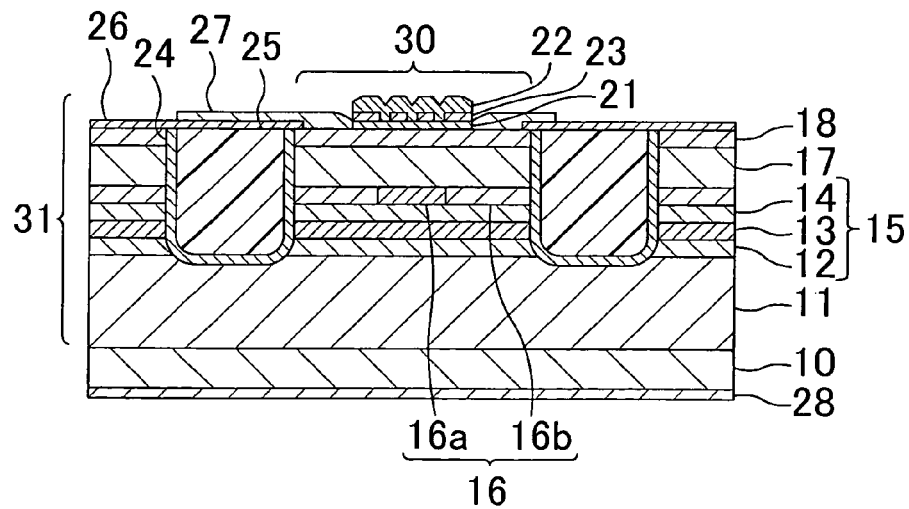

Next, as shown in FIG. 14C, an upper layer 22 made of SiN is formed to cover the metal film 23. Subsequently, the thickness of the substrate 10 is adjusted to a given thickness by polishing and etching, after which a film made of, e.g., an alloy of Au, Ge, and Ni is formed on the lower surface of the substrate 10 as a lower contact electrode 28. Then, a heat treatment is performed in a nitrogen atmosphere at about 400° C. for 10 minutes, whereby an ohmic contact is formed between the lower contact electrode 28 and the substrate 10 and between the upper contact electrode 27 and the p-type contact layer 18.

Although in this embodiment the method for fabricating the semiconductor light emitting device of the first embodiment has been described, the semiconductor light emitting devices described in the other embodiments can also be fabricated in like manner. Also, the high resistance region 16b in the current confinement layer 16 is formed by thermal oxidation in this embodiment, but may alternatively be formed by injecting protons.

Moreover, in this embodiment, the exemplary case in which the upper surface of the resin film 25 is flush with the upper surface of the p-type contact layer 18 has been described. However, if the resin film 25 and the mesa 30 are formed without creating a level difference therebetween, it is possible to increase the processing accuracy of the metal film 23. In that case, the resin film 25 may have a shape in which the central portion thereof protrudes.

A resin film 25 having such a shape may be formed as follows. After the formation of the mesa 30, a first protective film 24 made of $SiO_2$ is formed on the upper surface and side faces of the mesa 30 and on the surface of the first reflector 11. Subsequently, part of a resin film 25 made of a BCB resin is applied onto the first protective film 24 and then the resin is cured by a heat treatment performed in a nitrogen atmosphere. A BCB resin is again applied onto the cured resin.

Next, the resin film 25 is exposed to light and developed except for the portion thereof located on the upper surface of the mesa 30, thereby removing the uncured portion of the resin film 25 from the upper surface of the mesa 30. In this way, the resin film 25 is processed so that the part of the surface of the resin film 25 located on the upper surface of the mesa 30 is lower than the part of the surface of the resin film 25 located around the mesa 30.

The portion of the resin film 25 located on the mesa 30 is removed by a dry-etching process so that the first protective film 24 is exposed at the upper surface of the mesa 30. As the etching gas, a mixed gas of $CF_4$ and $O_2$ may be used. The first protective film 24 formed on the surface of the mesa 30 is used as a protective film in the dry-etching process. Thereafter, the resin film 25 is cured in a nitrogen atmosphere.

In this manner, the resin film 25 that is greater in height than the upper surface of the mesa 30 is formed without creating a level difference between the resin film 25 and the mesa 30.

As described above, the semiconductor light emitting devices according to the present invention realize semiconductor light emitting devices applicable to high-speed optical communication, in which the polarization mode of emitted light is stable and which has a wide laser modulation bandwidth. Therefore, the inventive semiconductor light emitting devices effectively function as semiconductor light emitting devices and the like including vertical cavity surface emitting laser devices.

What is claimed is:

1. A semiconductor light emitting device comprising:
a cavity including a mesa formed over a substrate, the mesa having an active layer and being isolated by a recess farmed around the mesa;
a resin layer with which the recess is filled; and
a metal film formed over a light output surface of the cavity and having an opening formed therein,
wherein light emitted from the active layer is output through the light output surface, and the opening has a diameter smaller than an emission wavelength of the emitted light,
two or more said openings are formed and arranged in a lattice, and
relation in $P = \lambda \times (i^2+j^2)^{0.5}/(\in_1 \in_2/(\in_1+\in_2))^{0.5}$ is satisfied where P is an opening period of the openings, $\in_1$ is a dielectric constant of the metal film, $\in_2$ is a dielectric constant of a material of a layer that is in contact with the metal film, and i and j are integers that are not negative.

2. The device of claim 1, wherein the diameter of the opening is smaller than or equal to one-half of the emission wavelength.

3. The device of claim 1, wherein the light output through the light output surface is a laser beam, and
in the laser beam, the value of a ratio of intensity of a TM wave component to intensity of a TE wave component is greater than or equal to two.

4. The device of claim 1, wherein in the metal film, the openings are arranged in a triangular lattice or a hexagonal lattice.

5. The device of claim 1, wherein a planar shape of the opening is anisotropic.

6. The device of claim 1, wherein the metal film has a thickness of from 100 nm to 500 nm.

7. The device of claim 1, wherein the metal film is made of silver, gold, or aluminum.

8. The device of claim 1, wherein the metal film is formed of two layers made of different materials.

9. The device of claim 8, wherein of the two layers of the metal film, the upper layer is thinner than the lower layer, and the lower layer is made of silver, gold, or aluminum.

10. The device of claim 8, wherein of the two layers of the metal film, the lower layer is made of silver and the upper layer is made of gold.

11. The device of claim 1, further comprising an intermediate layer formed on a surface of the metal film which is located closer to the active layer.

12. The device of claim 11, wherein the intermediate layer has a thickness for correcting phase change caused when the emitted light is reflected by the metal film.

13. The device of claim 12, wherein relation in $0.6 \times \lambda/n \times (\frac{1}{4}+\frac{1}{2}i) \leq d \leq \lambda/n \times (\frac{1}{4}+\frac{1}{2}i)$ is satisfied where d is the thickness of the intermediate layer, n is a refractive index of the intermediate layer, $\lambda$ is the wavelength of the emitted light, and i is an integer that is not negative.

14. The device of claim 11, wherein the intermediate layer is a dielectric film.

15. The device of claim 14, wherein the dielectric film is a single-layer film made of one element, or a multilayer film made of two or more elements, the one element and the two or more elements being selected from the group consisting of silicon oxide, silicon nitride, aluminum oxide, titanium oxide, and tantalum oxide.

16. The device of claim 11, wherein the intermediate layer is a transparent conductive film.

17. The device of claim 16, wherein the transparent conductive film is made of indium tin oxide, zinc oxide, or tin oxide.

18. The device of claim 11, wherein the intermediate layer is a semiconductor multilayer film.

19. The device of claim 1, further comprising two reflectors provided to a side of the active layer which is located closer to the light output surface and to a side of the active layer which is located opposite to the light output surface, wherein the metal film functions as the reflector provided to the side closer to the light output surface.

20. The device of claim 19, wherein the reflector provided to the side closer to the light output surface includes a first semiconductor multilayer film formed on a surface of the metal film which is located closer to the active layer.

21. The device of claim 20, wherein the number of periods in the first semiconductor multilayer film is adjusted according to a reflectivity of the metal film.

22. The device of claim 20, wherein the number of periods in the first semiconductor multilayer film is from nine to twenty-two.

23. The device of claim 19, wherein the reflectors have a reflectivity of from 99.4% to 99.9%.

24. The device of claim 19, wherein the reflector provided to the side opposite to the light output surface is formed of a second semiconductor multilayer film.

25. The device of claim 11, further comprising an upper layer formed on a surface of the metal film which opposes the surface of the metal film that is located closer to the active layer.

26. The device of claim 1, further comprising:

a first protective layer formed between the resin layer and side and bottom faces of the recess;

a second protective layer for covering an upper surface of the resin layer; and an electrode, formed on the second protective layer, for injecting current into the active layer.

27. The device of claim 26, wherein the resin layer is completely surrounded by the first and second protective layers.

28. The device of claim 26, wherein the first and second protective layers are each made of $SiO_2$, SiN, SiON, $Nb_2O_5$, $ZrO_2$, or $Ta_2O_5$.

29. The device of claim 26, wherein at least part of the resin layer is located higher than an upper surface of the mesa.

30. The device of claim 26, wherein the upper surface of the resin layer and an upper surface of the mesa are connected with no level difference formed therebetween.

31. The device of claim 26, wherein a relative dielectric constant of the resin layer is smaller than or equal to three.

32. The device of claim 31, wherein the resin layer is made of benzocyclobutene resin.

33. The device of claim 1, further comprising a current confinement layer provided in the mesa between the active layer and the metal film and including a high-resistance region and a current confinement region, the high-resistance region being a selectively oxidized region or a region into which protons have been injected selectively, the current confinement region being surrounded by the high-resistance region.

34. The device of claim 33, wherein the current confinement region has a diameter of 10 μm or smaller.

35. The device of claim 1, wherein the diameter of the mesa is adjusted so that the volume of the mesa is greater than or equal to one-half of the volume of the entire device.

36. The device of claim 26, wherein the side faces of the mesa are inclined.

* * * * *